United States Patent [19]
Harada et al.

[11] Patent Number: 5,136,360
[45] Date of Patent: Aug. 4, 1992

[54] ELECTRONIC CIRCUIT DEVICE, METHOD OF CONNECTING WITH SOLDER AND SOLDER FOR CONNECTING GOLD-PLATED TERMINALS

[75] Inventors: Masahide Harada, Fujisawa; Ryohei Satoh, Yokohama; Fumiyuki Kobayashi, Sagamihara; Takaji Takenaka, Hadano; Toshitada Netsu, Hadano; Hideaki Sasaki, Hadano; Mitugu Shirai, Hadano, all of Japan

[73] Assignee: Hitachi, Ltd., Tokyo, Japan

[21] Appl. No.: 563,281

[22] Filed: Aug. 6, 1990

[30] Foreign Application Priority Data

Aug. 7, 1989 [JP] Japan .................................. 1-202850

[51] Int. Cl.$^5$ ...................... H01L 23/48; H01L 29/46
[52] U.S. Cl. .................................. 357/65; 357/67; 148/24; 228/56.3
[58] Field of Search ...................... 357/65, 67; 148/24; 228/56.3

[56] References Cited

U.S. PATENT DOCUMENTS

| | | | |
|---|---|---|---|
| 3,212,160 | 10/1965 | Dale et al. | 357/67 |
| 3,986,255 | 10/1976 | Mandal | 357/67 |
| 4,872,047 | 10/1989 | Fister et al. | 357/67 |
| 5,001,542 | 3/1991 | Tsukagoshi et al. | 357/67 |
| 5,027,189 | 6/1991 | Shannon et al. | 357/65 |

FOREIGN PATENT DOCUMENTS

| | | | |
|---|---|---|---|
| 52-50167 | 4/1977 | Japan | 357/67 |
| 62-166091 | 7/1987 | Japan . | |

OTHER PUBLICATIONS

"A Guide to Preform Soldering", Alloys Unlimited, Inc., 1959.
"Giometric Optimization of Controlled Collapse Interconnections", *IBM Journal*, May 1969, pp. 251–265.
"Metallurgical Aspects of Soldering Gold and Gold Plating", *Proc. Tech. Programme Intern.*, 1968, pp. 211–231.
"High Strength, Low Temperature Bonding with Silver-Tin Solders", *Welding Journal*, Oct. 1979, pp. 838–842.

*Primary Examiner*—Andrew J. James
*Assistant Examiner*—Mahshid Saadat
*Attorney, Agent, or Firm*—Fay, Sharpe, Beall, Fagan, Minnich & McKee

[57] ABSTRACT

An electronic circuit device comprising an electronic part having a gold-plated connecting terminal arranged thereon connected through a solder to a circuit substrate on the predetermined connecting element thereof, in which the connecting terminal of the electronic part and the solder-connected portion of the circuit substrate are constituted by an alloy composition consisting of 1.0 to 8.0 wt. % of Ag, 0.1 to 6.0 wt % of Au and the balance of Sn, is provided. The device is made by using a solder for use in connecting a gold-plated connecting terminal which consists of 1.0 to 8.0 wt % of Ag and the balance of Sn and a method of connecting an electronic part having a gold-plated connecting terminal arranged thereon to a circuit substrate, which comprises the steps of placing the electronic part and the gold-plated connected terminal so as to face each other via a solder and then melting the solder to connect and fix the connecting terminal to the circuit substrate onto the predetermined element thereof, the composition of said solder consisting of 1.0 to 8.0 wt % Ag and the balance of Sn.

1 Claim, 5 Drawing Sheets

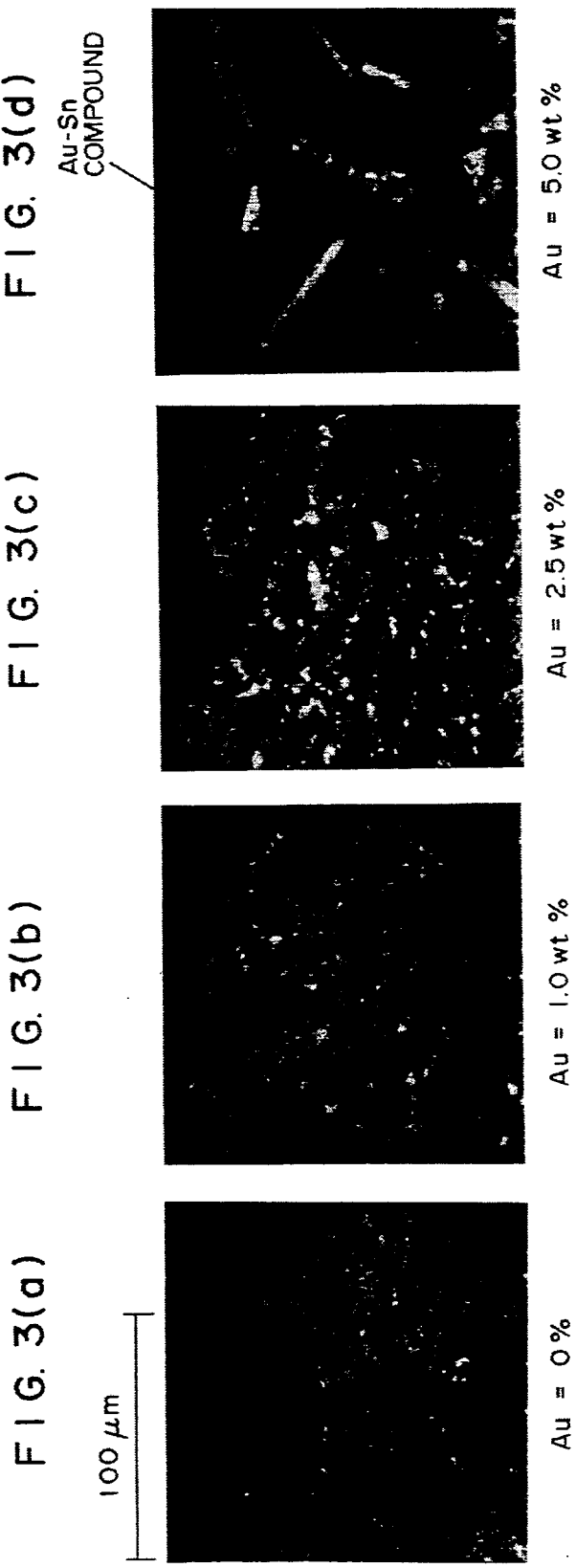

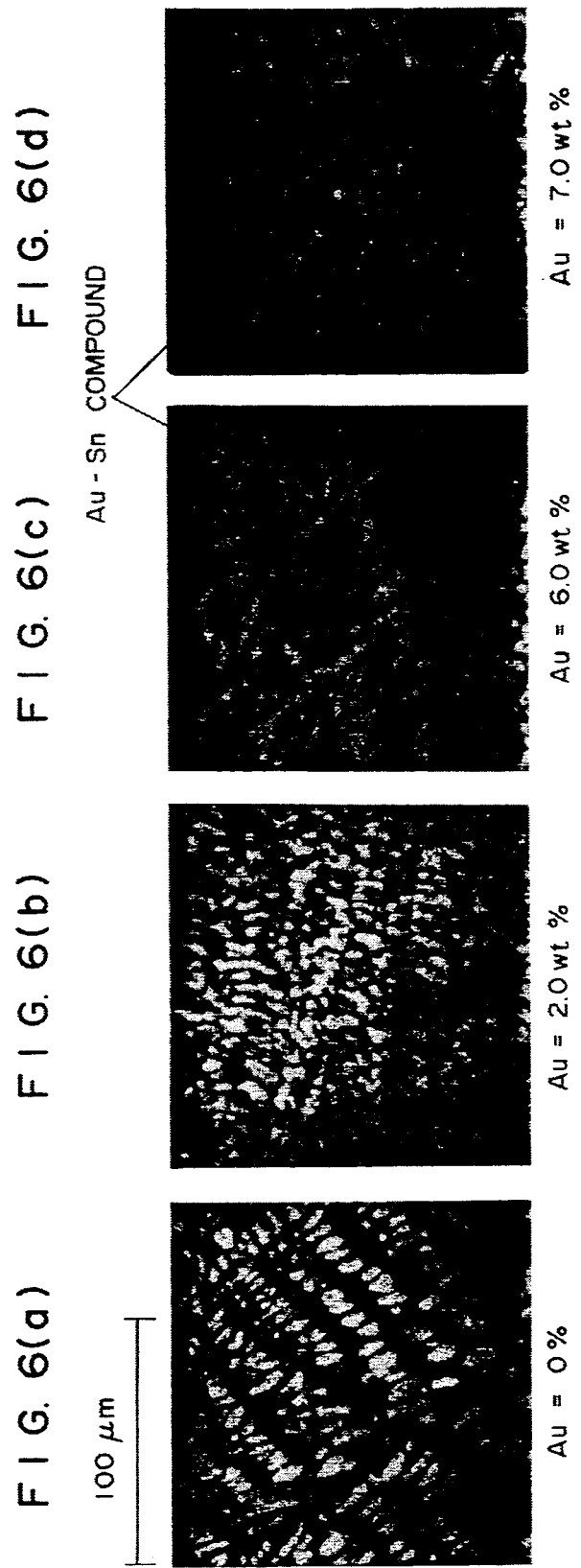

0.5 μm

Sn 3.5 Ag SOLDER

Sn 37 Pb SOLDER

ELECTRONIC CIRCUIT DEVICE, METHOD OF CONNECTING WITH SOLDER AND SOLDER FOR CONNECTING GOLD-PLATED TERMINALS

BACKGROUND OF THE INVENTION

1. Field of the Invention

The present invention relates to an electronic circuit device in which the gold-plated terminal of an electronic part is connected with a solder to a circuit substrate, a method of connecting the gold-plated terminal to the circuit substrate with a solder, and the solder for use in connecting the gold-plated terminals.

2. Description of Related Art

Hitherto there has been proposed such an example of electronic circuit device as mentioned below, in order to raise the calculation speed and operating efficiency of an electronic computer, particularly a supercomputer.

A plurality of large scale integrated semiconductor devices, i.e., LSI chips are mounted by connecting with minute solder balls. This solder-ball connecting method is disclosed in, for example, IBM Journal, May 1969, pp. 251-265.

Since a considerable amount of electric power is supplied to the LSI chips in the actual working of the computer, the problem of heat occurs. That is, the overheating of the LSI chips breaks the chips. In order to prevent this overheating, a cooling cap is arranged over the LSI chips on the substrate. In order to connect the substrate to an outside circuit in an electric and mechanical manner, connecting pins are provided on the substrate on the back side thereof. These connections require high reliability in a mechanical, electrical and chemical point of view. As a solder for connecting have been widely used Sn-Pb alloys, particularly an eutectic solder consisting of 63.0 wt % of Sn and 37.0 wt % of Pb (hereinafter referred to as Sn37Pb solder). This solder is most generally used since it has a good elongation property and a relatively low and constant melting point of 183° C. so that it is easily operable.

Circuit substrates having LSI or IC mounted thereon are normally made of non-metal materials such as ceramics or resins. Therefore, in order to connect these materials with a solder, the areas of the substrate to be connected are often plated with a metal to secure the wettability of the solder to the substrate. In the case of connecting with minute solder balls, round-shaped minute metal platings are normally provided on the substrate. Particularly, gold platings are preferred as the metal platings, because oxides are hardly formed on the gold platings and the gold platings are well reactive with the solder.

However, the gold-plated base materials (i.e., connecting terminals) produce a gold-tin compound, as mentioned below, when connected with the Sn37Pb solder. In this case there is a problem that coarsening of the compound causes connected portions to be embrittled so that the reliability of connection is lowered. This problem is disclosed in, for example, Proc. Tech. Programme Intern., 1968, pp. 211-231.

In order to raise the calculation and operating efficiency of the supercomputer, various packaging methods have been proposed and the structure of the electronic circuit device is multilayered and more complicated. For example, in the abovementioned electronic circuit device, an LSI chip is mounted on each of carrier chips and sealed with a cap. A plurality of the thus cap-sealed carrier chips are mounted on a circuit substrate having a larger surface area than that of the carrier chip. When the electronic circuit device having such a structure is to be made, the LSI chip is firstly connected with minute solder balls, and then the cap and the carrier chip are joined together. The melting point of a solder to be used in this joining must be lower than that of a solder used in the connection of the LSI chip in order to allow the connected portions not to be molten. The same things are applicable to the subsequent steps. A lower melting point solder is required by a later step. Thus, the electronic circuit device having a multilayered and more complicated structure requires solders having different melting points corresponding to the connecting temperature required. For this purpose, Pb5Sn, Pb10Sn, Pb37Sn, Pb37Sn18Bi and the like have been generally used. In addition to these Sn-Pb system alloy solders, Sn-Ag system solders containing a small amount of silver are also known. However, these Sn-Ag system solders have not been studied, because they are not operable to connection of fine patterns in which LSI chips are connected to a circuit substrate with minute soldering balls. The first reason is that since the solder contains a large amount of tin there is such a danger that thin whiskers and low-temperature tin-transformed phases are formed. The production of the tin whiskers introduces shortage of fine electrodes to adjacent ones with high probability. Furthermore, the low-temperature tin-transformed phases is produced by lattice transformation from the $\beta$-phase to the $\alpha$-phase, thereby causing the expansion of volume to break the connected portions. The second reason is that the presence of silver easily causes migration. The Sn-Ag system solders are disclosed in, for example, Japanese Patent KOKAI (Laid-Open) No. 62-166091. However, this solder disclosed in the KOKAI is in a cream state. Therefore, this solder cannot be used for the connection requiring to use the minute soldering balls.

Gold-plated base materials are well wettable to the Sn37Pb solder at the plated areas. This is because tin in the Sn37Pb solder in a molten state is easily reactive with gold. Thus, the solder is spread on the plated areas while forming a gold-tin compound comprises principally of $AuSn_4$. The gold-tin compound is very hard and brittle. Furthermore, if the gold content of the solder-connected portions is high, the resultant gold-tin compound has a coarsened crystal grains. If the connected portions have larger gold-tin crystal grains, force externally added may be concentrated onto the boundary between the compound and the base material to cause the connected portions to break since the portions have gotten hard and brittle. Thus, the solderconnected portions have conspicuously lowered reliability. This phenomenon can be quantitatively rated by determining the tensile elongation of the solder-connected portions. A relationship between the gold content of the Sn37Pb solder-connected portion and the tensile elongation is shown in FIG. 2. Furthermore, FIGS. 3(a), 3(b), 3(c) and 3(d) are electron microphotographs showing the microstructures of metal of the connected portions. That is, as seen from FIG. 2, the tensile elongation (expressed in terms of tensile fracture elongation) is conspicuously lowered at the gold content of 3 wt %. Accordingly, as seen from FIGS. 3(a) to 3(d), the crystal grains of the gold-tin compound are coarsened as shown with an arrow mark.

The tensile testing method and the method for the observation of the microstructure used in the determination above will be detailedly discussed later. From these figures, it is seen that if the gold content of the Sn37Pb solder exceeds 3 wt %, the tensile elongated is 20% or less and the connected portion becomes hard and brittle. In such a state, force externally added is concentrated onto the boundary of the gold-tin compound to cause the connected portion to be broken. One of ways for preventing this breaking is considered to make the thickness of the gold plating as small as possible, or to increase an amount of the solder so as to adjust it to 3.0 wt % or less. This way is not practical for the following reasons.

In plating a predetermined area on a modular circuit substrate made of ceramics in an electronic circuit device, with gold, the area is often firstly plated with nickel or cobalt having a good affinity to the ceramics and then with gold on the nickel or cobalt. After the plating, in order to improve the adhesion between these two kinds of the platings, they are generally heat treated and held at a temperature of several hundreds. In this case, mutual diffusion takes place between the two kinds of the plating. If the gold plating is thin, then the underlayer, nickel or cobalt is exposed on the surface of the gold plating, which causes the wettability to be deteriorated. For the purpose of avoiding this, the gold plating is required to have a thickness of at least several microns.

In electronic circuit devices, one modular substrate has various parts mounted thereon. The solder amount in the connected portions varies depending upon the kind of parts to be connected. The substrate is plated at a time for technical and economical reasons and the thickness of the plating is uniform. Thus, the thickness of the plating cannot be changed according to the kind of the parts to be connected in one substrate. Therefore, the gold contents of the solder cannot be controlled at a time for every parts using the different solder amounts. In the case where a small size part is connected with a solder in a small amount, the gold content of the solder is high at the connected portion. To avoid this, the solder amount must be increased, so the part must be made larger. This undesirably inhibits the high-densification of the parts mounted on the substrate.

As is seen from the above, the conventional method of connecting parts using a solder of Sn37Pb have such problems that connected portions have reliability reduced due to the presence of gold and the solder amount is increased to avoid the reduction of reliability, so that the high-densification of parts on a substrate is prevented.

The above-mentioned literatures and Japanese Patent KOKAI (Laid-Open) No. 62-166091 disclose a special solder in a cream state (Sn-Ag solders containing a flux) other than the Sn-Pb alloys. However, such a solder has never been studied for use in fine connections requiring high reliability in the field of electronic circuit devices, for the reasons as mentioned above.

SUMMARY OF THE INVENTION

The primary object of the present invention is to provide a solder for use in connecting gold-plated connecting terminals.

Another object of the present invention is to provide a method of connecting gold-plated terminals on electronic parts.

Further object of the present invention is to provide an electronic circuit device having circuit chips connected thereon with the solder for use in connecting gold-plated connecting terminals.

BRIEF DESCRIPTIONS OF THE DRAWINGS

FIGS. 3(a), 3(b), 3(c) and 3(d) are microphotographs of the microstructures of a conventional Sn37Pb solder containing gold incorporated therein.

Figure 4:
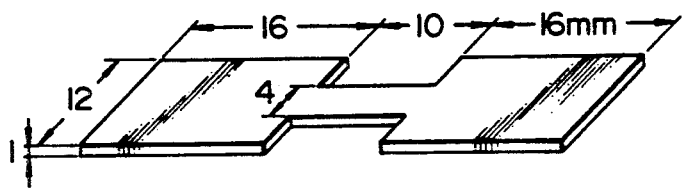

FIG. 4 is a perspective view showing the shape and dimension of a tensile test specimen for rating the tensile strength of solder.

Figure 5A:
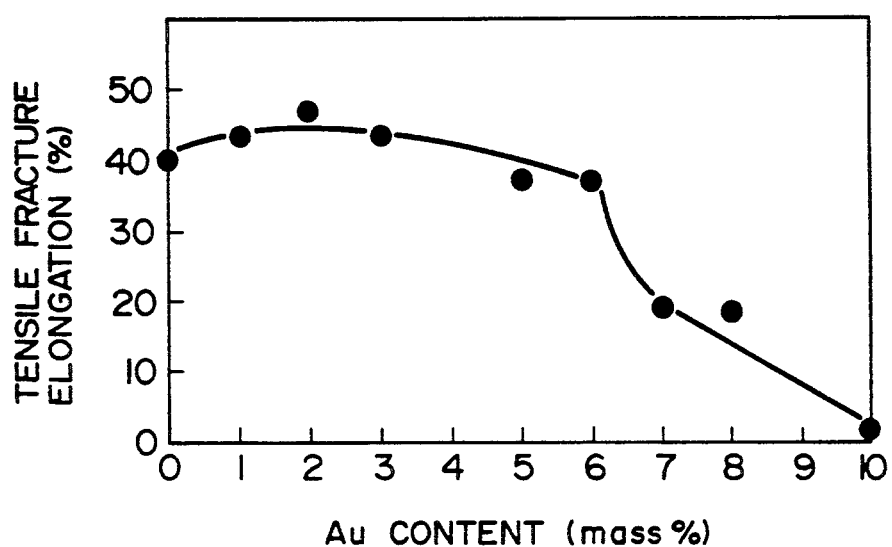

FIG. 5(a) is a graph showing the characteristic curve of tensile elongation versus the gold content of an Sn3.5Ag solder according to the present invention.

Figure 5B:
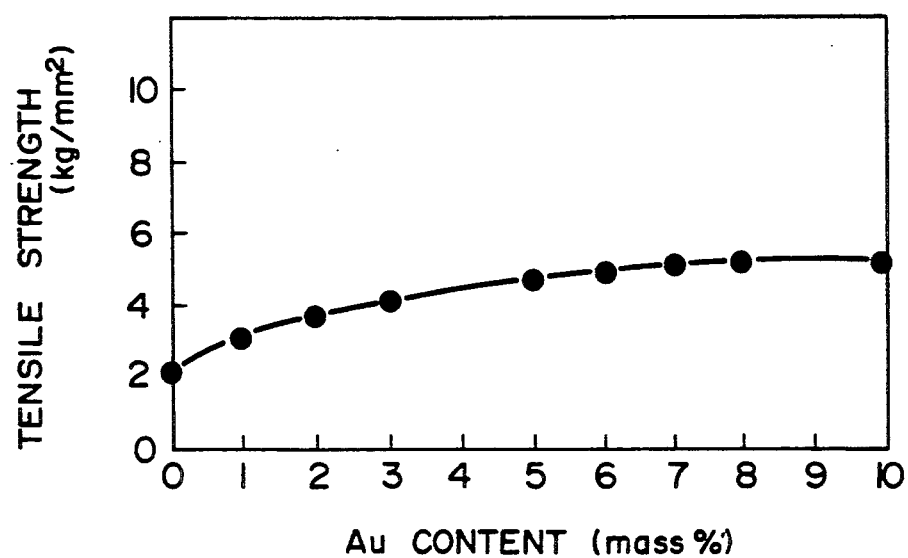

FIG. 5(b) is a graph showing the characteristic curve of tensile strength versus the gold content of an Sn3.5Ag solder according to the present invention.

FIGS. 6(a) to 6(d) are microphotographs of the microstructures of the Sn3.5Ag solder containing gold incorporated therein for illustrating the present invention.

Figure 7A:
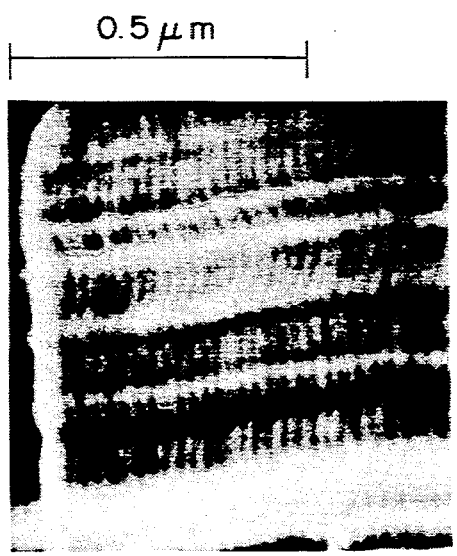

FIG. 7(a) is an electron microphotograph of the streaking pattern appearing on the rupture cross section of the solder connected portion according to the present invention when subjected to the temperature cycle test.

Figure 7B:

FIG. 7(b) is an electron microphotograph of the streaking pattern appearing on the rupture cross section of a conventional solder connected portion according to the present invention when subjected to the temperature cycle test.

DETAILED DESCRIPTION OF PREFERRED EMBODIMENTS

In accordance with the present invention, there can be provided 1) an electronic circuit device comprising an electronic part(s) having a gold-plated connecting terminal(s) arranged thereon connected through a solder to a circuit substrate on the predetermined connecting element(s) thereof, in which the connecting terminal(s) of the electronic part(s) and the solderconnected portion(s) of the circuit substrate are constituted by an alloy composition consisting of 1.0 to 8.0 wt % of Ag, 0.1 to 6.0 wt % of Au and the balance of Sn; 2) a method of connecting an electronic part(s) having a gold-plated connecting terminal(s) arranged thereon to a circuit substrate, which comprises the steps of placing the electronic part(s) and the gold-plated connecting terminal(s) so as to face each other via a solder and then melting the solder to connect and fix the connecting terminal(s) to the circuit substrate onto the predetermined element(s) thereof, the composition of said solder consisting of 1.0 to 8.0 wt % Ag and the balance of Sn; 3) the above-mentioned method, wherein the above-mentioned solder is in a form of minute solder ball, the solder ball(s) are placed between the connecting terminal(s) and the connecting element(s) of the substrate, and said solder balls are molten to connect and fix both the terminal(s) to the element(s); 4) a solder for use in connecting a gold-plated connecting terminal(s) which consists of 1.0 to 8.0 wt % of Ag and the balance of Sn; and 5) a solder ball for use in connecting a gold-plated connecting terminal(s) which is made of the abovementioned solder.

The present invention as mentioned above has been based on the findings resulting from the present inventors' research of an influence of gold on the elongation of various low-melting alloys and wettability. A solder alloy consisting essentially of 1.0 to 8.0 wt % of silver and the balance of tin including incidental impurities has a good wettability for connecting terminals and a satisfactory elongation of about 40% even when it contains up to 6 wt % of gold incorporated therein. Thus, it has an excellent reliability in connecting and an increased tensile strength. The reasons for selecting the ranges of 1.0 to 8.0 wt % of silver and the balance of tin are as follows:

Use of tin (Sn) as the base of a solder can secure the reactivity between the solder and the gold plating, that is, the wettability of the solder. Incorporation of silver (Ag) in an amount of 1.0 wt % or more increase the strength of connected portions and prevents such a phenomenon that the whisker formation and low-temperature transformation easily occur with the tin base only. The most preferred composition is 3.5 wt % of silver and the balance of tin. An alloy having the composition is in an eutictic form and has a melting point of 221° C. Therefore, the workability of the alloy is very excellent. Incorporation of at most 8.0 wt % of silver firstly prevents the migration. Furthermore, if the amount of silver exceeds 8.0 wt %, then the liquidus temperature of this alloy is higher 250° C. and the solid-liquid coexistence width is 30° C. or higher. Therefore, the workability of soldering is highly poor. For the reasons, the silver content of the solder alloy ranges from 1.0 to 8.0 wt %.

In accordance with the present invention, the gold content ranges from 0.01 to 6.0 wt % for the following reasons:

If the gold content exceeds 6.0 wt %, the elongation is conspicuously lowered and the connected portion is easily broken. No high reliability can be obtained in connecting. Furthermore, if the gold content is less than 0.01 wt %, the amount of gold plating is not so satisfactory that the strength of the connected portion may be increased.

In order to clarify the maintenance of the elongation characteristics of the solder according to the present invention in the connected portion and the influence of the solder on the strength of the connected portion, tensile test pieces were made by adding amounts of gold to a tin-silver alloy and subjected to the measurements of the tensile elongation and strength and the observation of the microstructures of the alloys. For comparison, the conventional Sn37Pb alloy solder was subjected to the same experiment.

The procedures of the experiment are as follows: a tin-silver alloy solder consisting of 3.5 wt % of silver and the balance of tin was used as a typical tin-silver alloy solder and to this solder was added gold (purity: 99.99%) in an amount of 1.0 wt %, 2.0 wt %, 3.0 wt %, 5.0 wt %, 6.0 wt %, 7.0 wt %, 8.0 wt % and 10.0 wt %. Each of the mixtures was placed in a crucible, molten by heating to 240° C. and agitated so that the mixture was uniform. The melt was poured into a carbon-made mold and solidified. Thus, the test pieces having the shape as shown in FIG. 4 were obtained. For comparison, these procedures were repeated to the Sn37Pb solder to obtain test pieces.

These test pieces were subjected to the tensile test with an Instron-type tensile testing machine. The results are shown in FIGS. 5(a) and 5(b). FIG. 5(a) is a tensile break elongation characteristic curve, and FIG. 5(b) is a tensile strength characteristic curve. As seen from these figures, the tensile break elongation was about 40% at a gold content of 6.0 wt % or less. Thus, the elongation was good. Furthermore, the tensile strength was increased as the gold content was increased. The cross-sectional surfaces of the test pieces were polished with a diamond paste and observed on the microstructure thereof with a microscope. FIGS. 6(a), 6(b), 6(c) and 6(d) are microphotographs showing the results of this observation with the gold contents of 0 wt %, 2.0 wt %, 6.0 wt % and 7.0 wt %, respectively. In these microphotographs, gold-tin compounds are shown with arrow marks. These compounds are very hard and brittle and hence cause solder break when the crystal grains of the compounds are coarsened. In FIG. 6(c), the compounds are observed to be in a slightly thin linear crystal form as shown with the arrow mark. In FIG. 6(d), this linear crystal form is clearly seen. As is clear from these microphotographs, the tin-silver solder alloys containing gold added thereto contain a small size gold-tin compound in a spherical crystal form as a whole at a gold content of 6 wt % or less. For this, an external force is scarcely concentrated onto grain boundaries of part of the compounds, so that the alloy exhibit good elongation. Furthermore, the alloy is of a dispersion strengthened type and an increased strength. Thus, the solder of the alloy has a high reliability at the connected portion with the solder alloy. On the other hand, the comparative solder alloy of Sn37Pb has coarsened grains of the gold-tin compound at a gold content of 3 wt % or more, as shown in FIGS. 3(a) to 3(d). When an external force is applied, this compound is concentrated to the grain boundaries and the connected portion is easily broken at the grain boundaries.

The present invention will be illustrated below with reference to some examples and the drawings.

EXAMPLE 1

Figure 1:
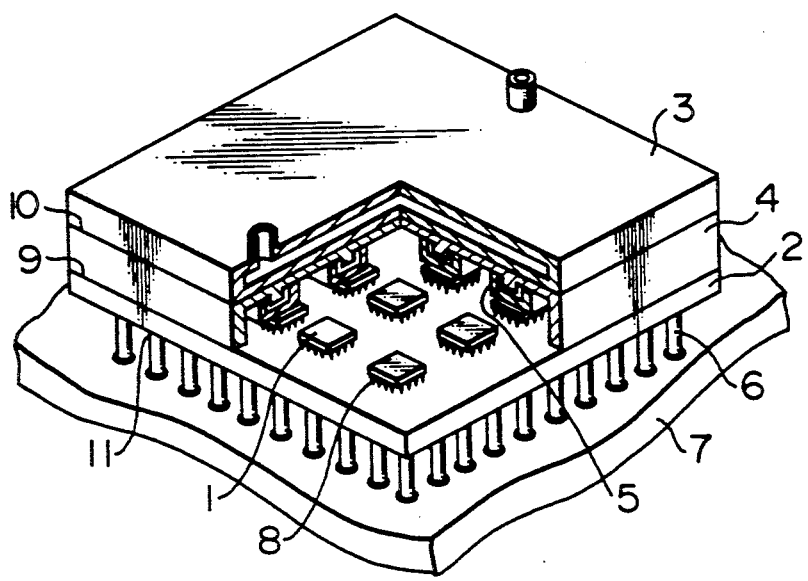
FIG. 1 is a cross-sectional partial perspective view of an embodiment of the electronic circuit devices according to the present invention.
Figure 2:
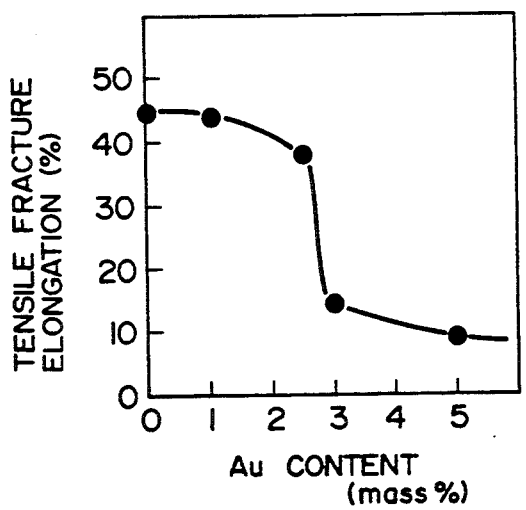
FIG. 2 is a characteristic curve graph showing a relation between the gold content and tensile elongation of a conventional solder of Sn37Pb.

FIG. 1 is a perspective cross-sectional partial view of one embodiment of the electronic circuit devices according to the present invention, in which LSI chips having connecting terminals plated with gold of 2 μm thick and a ceramic-made multiwiring substrate having electrode connectors plated with gold of 2 μm thick thereon were connected together with minute solder balls consisting of 3.5 wt % of silver and the balance of tin.

The electronic circuit device according to the present invention is constituted by arranging a plurality of LSI chips 1 on a multiwiring substrate 2 in accordance with a predetermined wiring pattern, mounting thermally conductive carrier chips 5 on the LSI chips 1, and placing a cap 4 covering the carrier chips on the multiwiring substrate 2, in which a cooling plate 3 is provided on the top face of the cap 4. The multiwiring substrate 2 is placed on connecting pins 6 which are beforehand bonded on a board 7.

The procedures for producing the electronic circuit device as mentioned above were as follows:

A first solder alloy used in this example was prepared by mixing silver of 99.99% in purity and tin of 99.99% in purity in a proportion of 3.5 wt % silver and 96.5 wt % tin, melting and solidifying the mixture to prepare solder balls of 0.3 mm in diameter. A second solder alloy used was 37.0 wt % Sn-45.0 wt % Pb-18.0 wt % Bi alloy prepared from Sn of 99.99% in purity, Pb of 99.99% in purity and Bi of 99.99% in purity. A third solder alloy used was 98.0 wt % Pb-2.0 wt % Sn. Furthermore, a silver solder of 72.0 wt % Ag-28.0 wt % Cu was prepared from Ag of 99 99% in purity and Cu of 99.99% in purity.

There were provided LSI chips 1 having Ni plating of 5 μm thick applied to predetermined portions thereof to be connected and then gold plating of 3 μm thick applied on the Ni plating; ceramic-made multiwiring substrate 2; cooling plate 3; cap 4; thermally conductive carrier chips 5; connecting pins 6; and wiring board 7.

The silver solder 11 was placed between the back side of the ceramic-made multiwiring substrate 2 and the connecting pins 6 and subjected to the heat treatment such that it was heated to 800° C. and cooled (hereinafter referred to as the heat treatment), thereby connecting the substrate and the connecting pins. The pins were beforehand bonded to the wiring board.

The electrode terminals on the LSI chips 1 and the electrode-connecting portions on the ceramic-made multiwiring substrate 2 were connected together by placing the minute solder balls 8 consisting of the first solder alloy according to the present invention as mentioned above between the electrode terminals and the electrodeconnecting portions and subjecting them to the heat treatment at 240° C.

On the other hand, between the cooling plate 3 and the cap 4 was placed the third solder alloy 10, which was subjected to the heat treatment, thereby connecting the cooling plate and the cap.

The thermally conductive carrier chips 5 were placed on the LSI chips 1 connected onto the ceramic-made multiwiring substrate 2, and then the periphery of the substrate 2 and the edges of the cap 4 at the opposite side of the cooling plate 3 were connected together by placing the second solder alloy 9 therebetween and subjecting them to the heat treatment at 200° C.

Examination was conducted on whether or not the connecting procedures used in this example gave highly reliable connections, i.e., the reliability of connection required by the present invention could be obtained.

For the comparison, an electronic circuit device was prepared in the same procedures as mentioned above, except that Sn37Pb was substituted for the tin-silver alloys of the present invention. The tensile elongation characteristic of the connected portions using each of the solders has already been shown above. It has been found that the tin-silver solder alloys tolerate the incorporation of gold in a larger amount that the Sn37Pb solder alloy.

In the electronic circuit device as shown in this example, the structure in which the LSI chips 1 and a module substrate (i.e., the multiwiring substrate 2 in this example) were connected with the minute solder balls has temperature gradients produced by the heat generation of the chips during the operation between the chips, solder-connected portions and module substrate. The chips, solder and module substrate have respective different coefficients of thermal expansion. Therefore, the solder-connected portions undergo an external force due to the difference in the thermal expansion in every switchings of the electronic circuit, which causes cracks to propagate bit by bit through the connected portions. In this case, if there is the gold-tin compound coarsened in grain size, then the cracks more easily propagate along the grain boundaries into the interior of the connected portions. As a result, the life of the connected portions is shortened. Thus, the connection reliability of the fine connected portions in the electronic circuit device can be evaluated with a rate of crack propagation.

In order to evaluate the rate of crack propagation, a specimen using the tin-silver alloy solder balls according to the present invention and a specimen using the conventional Sn37Pb solder balls were left to stand at temperatures of +150° C. and −50° C. for 30 minutes, respectively. These specimens were subjected to the 1000 cycles of temperature change as a cycle of one hour in total time.

Thereafter, the LSI chips 1 were released off from the multiwiring substrate 2. Small streaking patterns are seen on the broken face of the connected portions. One of the streakings corresponds to one crack propagating in one cycle. The electron microphotographs of the two specimens at the similar positions of the solder-connected portions are shown in FIGS. 7(a) and 7(b). Streaking patterns are seen in these Figures. FIG. 7(a) concerns an embodiment of the present invention and FIG. 7(b) a conventional example. The comparison of FIGS. 7(a) and 7(b) reveals that the interval of the streakings appearing in the portions connected with the tin-silver solder according to the present invention is much smaller than that of the streakings appearing in the portions connected with the conventional Sn37Pb solder. That is, the tin-silver solder according to the present invention has a lower crack propagation than that of the conventional solder, which means that the life of connection is longer and the reliability of connection is better.

EXAMPLE 2

For the first solder of 3.5 wt % Ag-96.5 wt % Sn used in EXAMPLE 1 was substituted a solder of 2.5 wt % Ag-97.5 wt % Sn, which was prepared by uniformly mixing and melting silver, tin and gold all in purity of 99.99%. The solder was formed in balls of 0.3 mm in diameter. The assembly of the device including LSI chips and a multiwiring substrate was made in the same manner as in EXAMPLE 1. The fine connections between the LSI chips and the multiwiring substrate were improved in strength and exhibited a high reliability of connection.

EXAMPLE 3

For the first solder of 3.5 wt % Ag-96.5 wt % Sn used in EXAMPLE 1 was substituted a solder of 3.0 wt % Ag-97.0 wt % Sn, which was prepared by uniformly mixing and melting silver, tin and gold all in purity of 99.99%. The solder was formed in balls of 0.3 mm in diameter. The assembly of the device including LSI chips and a multiwiring substrate was made in the same manner as in EXAMPLE 1. The fine connections between the LSI chips and the multiwiring substrate were improved in strength and exhibited a high reliability of connection.

EXAMPLE 4

For the first solder of 3.5 wt % Ag-96.5 wt % Sn used in EXAMPLE 1 was substituted a solder of 7.5 wt % Ag-92.5 wt % Sn, which was prepared by uniformly mixing and melting silver, tin and gold all in purity of 99.99%. The solder was formed in balls of 0.3 mm in diameter. The assembly of the device including LSI chips and a multiwiring substrate was made in the same manner as in EXAMPLE 1. The fine connections between the LSI chips and the multiwiring substrate were improved in strength and exhibited a high reliability of connection.

The present invention should not be limited to only the examples mentioned above and can include various modifications. For example, the metallization of the electronic parts to be connected can be made with a known alloy such as a chromium-nickel-gold alloy, titanium-gold alloy or the like as well as the nickel-gold alloy. The connecting method used in the present invention is applicable to the solder alloy 9 or 10 in the electronic circuit device as shown in FIG. 1. However, in this case, it should be noted that the method is chosen taking an account of the melting points of the solders used at the other positions. Furthermore, the present invention should not be limited to only the device as shown in FIG. 1.

What is claimed is:

1. An electronic circuit device comprising at least one electronic part having at least one gold-plated connecting terminal arranged thereon connected through a solder to a circuit substrate on at least one predetermined connecting element thereof, in which a solder interconnection between the terminal of the electronic part and the circuit substrate is constituted by an alloy composition consisting of 1.0 to 8.0 wt % of Ag, 0.1 to 6.0 wt % of Au and the balance of Sn.

* * * * *